(12) United States Patent
Kwon (10) Patent No.: US 6,639,865 B2
(45) Date of Patent: Oct. 28, 2003

(54) MEMORY DEVICE, METHOD OF ACCESSING THE MEMORY DEVICE, AND REED-SOLOMON DECODER INCLUDING THE MEMORY DEVICE

(75) Inventor: Hyung Joon Kwon, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 90 days.

(21) Appl. No.: 09/832,943

(22) Filed: Apr. 12, 2001

(65) Prior Publication Data

US 2002/0075715 A1 Jun. 20, 2002

(30) Foreign Application Priority Data

Oct. 25, 2000 (KR) .......................................... P00-62904

(51) Int. Cl.[7] ................................................. G11C 8/00
(52) U.S. Cl. ............................ 365/230.03; 365/189.04; 365/189.05
(58) Field of Search ..................... 365/230.03, 230.05, 365/230.06, 189.05, 189.04, 230.04

(56) References Cited

U.S. PATENT DOCUMENTS

| 4,725,987 A | 2/1988 | Cates ........................ 365/220 |
| 4,745,576 A | 5/1988 | Hasegawa et al. .......... 364/900 |
| 4,845,713 A | 7/1989 | Zook ........................... 371/37 |
| 4,868,812 A | 9/1989 | Kruger et al. ................ 370/56 |
| 5,446,743 A | 8/1995 | Zook ........................... 371/371 |
| 5,570,320 A | * 10/1996 | Runas ..................... 365/189.02 |
| 5,771,199 A | 6/1998 | Lee ........................ 365/230.03 |
| 5,774,648 A | 6/1998 | Kao et al. ................ 395/185.01 |
| 5,961,660 A | 10/1999 | Capps, Jr. et al. .......... 714/763 |
| 6,023,745 A | * 2/2000 | Lu ............................. 711/149 |
| 6,031,783 A | * 2/2000 | Proebsting .................. 365/221 |
| 6,044,206 A | * 3/2000 | Kohn ......................... 709/248 |
| 6,079,046 A | 6/2000 | Tamura et al. ............. 714/781 |
| 6,081,920 A | 6/2000 | Morelos-Zaragoza ....... 714/785 |
| 6,134,145 A | 10/2000 | Wong ..................... 365/185.22 |
| 6,137,807 A | * 10/2000 | Rusu et al. ................. 370/412 |

FOREIGN PATENT DOCUMENTS

| EP | 0 224 691 A2 | 6/1987 |
| EP | 0 261 751 A2 | 3/1988 |
| EP | 0 658 871 A2 | 6/1995 |
| WO | WO 95/12850 | 5/1995 |

* cited by examiner

Primary Examiner—Richard Elms
Assistant Examiner—Hien Nguyen
(74) Attorney, Agent, or Firm—Volentine Francos, PLLC

(57) ABSTRACT

A memory device employs multiple dual-bank RAMs to allow simultaneous write/read operations. The memory may be utilized in a high-speed block pipelined Reed-Solomon decoder for temporarily storing input codewords during pipelined processing. A memory controller enables writing to and reading from the dual-bank RAMs during each of successive frame periods such that each bank of the dual-bank RAMs is read every given number of frame periods and is written every same given number of frame periods, and such that a read bank is contained in a different one of the dual-bank RAMs than is a write bank in each of the successive frame periods.

20 Claims, 7 Drawing Sheets

MEMORY DEVICE, METHOD OF ACCESSING THE MEMORY DEVICE, AND REED-SOLOMON DECODER INCLUDING THE MEMORY DEVICE

BACKGROUND OF THE INVENTION

1. Field of the Invention

The present invention relates to memories which are used in digital devices to temporarily store data, and to Reed-Solomon decoders. More particularly, the present invention relates to circuits and methods for the buffering of data using dual-bank memories, and even more particularly, the present invention relates to the buffering of data in a high-speed block pipelined Reed-Solomon decoder.

2. Description of the Related Art

When transmitting or storing large quantities of digital data, errors inevitably occur in the data channels or transmission media. A variety of techniques are known which attempt to identify such errors and restore the data when feasible. Among these techniques, Reed-Solomon coding has become widely adopted. Reed-Solomon codes are block-based error correcting codes that exhibit excellent error correction capabilities and efficient coding and decoding characteristics, and thus have a wide range of applications in digital communications and storage.

Generally, a Reed-Solomon encoder forms a codeword containing n symbols (e.g., 8-bit bytes) by adding 2t parity symbols to a data block having k symbols of data, whereby 2t=n−k. Reed-Solomon codewords are commonly designated by the characters RS(n,k). For example, in the code RS(255,223), each codeword contains 255 codeword bytes, of which 223 bytes are data and 32 bytes are parity.

On the other hand, a Reed-Solomon decoder processes each codeword in an attempt to correct errors which occur during transmission or storage, and to recover the original data. The decoder is capable of correcting up to t error symbols in each codeword. For example, in the code RS(255,223), n−k=2t=32, and therefore up to 16 error symbols in each codeword can be corrected.

In general, the Reed Solomon decoding process can be partitioned into eight (8) major computational steps when both error and erasure correction are executed. An "erasure" occurs where the value of a symbol is incorrect, but the position of the symbol is known. An "error" occurs where no information is known with regard to an incorrect symbol. The computational steps of error and erasure decoding include (1) computing a syndrome from the received/retrieved input codeword to detect the existence of an error, (2) buffering erasure flags which are supplied in synchronization with the input codeword, (3) modifying the syndrome using the erasure flags, (4) producing an erasure locator polynomial, (5) computing coefficients of the error locator polynomial and an error evaluator polynomial using the modified syndrome values and the erasure locator polynomial, (6) searching the roots of the error locator polynomial, (7) computing the magnitude of error values, and (8) correcting the errors using the value obtained in step (4) and the location obtained in step (3). For error correction only (i.e., no erasure correction), steps (2), (3) and (4) are omitted.

The above steps (1) and (8) require memory access. That is, the received codeword is temporarily stored in a memory at step (1), and is later retrieved from the memory to be corrected in step (8).

The decoding computations (and associated hardware and/or software) of the Reed-Solomon decoder are more complex than those of the encoding process, and it is often difficult to realize decoders having sufficiently high processing speeds. This can be especially problematic in view of the present demand for higher-speed digital data processing systems.

In an effort to increase speeds, pipelining of the computations of the Reed Solomon decoder is a possible solution. However, the computations have different latencies depending on the number of errors and the lengths of the codewords, and accordingly, pipelining is limited by the unit or block having the longest latency. Moreover, even if latencies of the processing blocks were reduced to a single frame of n cycles (i.e., one codeword), the memory for temporarily storing the input codeword prior to correction creates a bottleneck in that at least 2n cycles are required to first store the codeword, and to then retrieve the codeword for correction thereof.

SUMMARY OF THE INVENTION

It is an objective of the present invention to provide a memory device, and a method of accessing a memory device, which execute read/write operations at high speeds, and which thus may be advantageously used in conjunction with a high-speed block pipelined Reed-Solomon decoder, and to provide a high-speed block pipelined Reed-Solomon decoder which exhibits a minimal memory access time.

According to one aspect of the invention, writing to and reading from a plurality of dual-bank RAMs is enabled during each of successive frame periods such that each bank of the dual-bank RAMs is read every given number of frame periods and is written every same given number of frame periods, and such that a read bank is contained in a different one of the plurality of dual-bank RAMs than is a write bank in each of the successive frame periods.

According to another aspect of the present invention, a memory includes a first dual-bank RAM having a first bank and a second bank, a second dual-bank RAM having a third bank and a fourth bank, and a third dual-bank RAM having a fifth bank and a sixth bank. Reading from the first through sixth data banks is enabled in order during successive frame periods such that each one of the first through sixth data banks is read every six frame periods, and writing to the first through sixth data banks is enabled in order during the successive frame periods such that each one of the first through sixth data banks is written every six frame periods. Further, during each of the frame periods, a one of the first through sixth data banks for which reading is enabled is contained in a different one of the first through third dual-bank RAMs than is a one of said first through sixth data banks for which writing is enabled.

According to still another aspect of the present invention, during each frame period, an offset from a data bank for which reading is enabled to a data bank for which writing is enabled is four (or three) data banks, such that each of the first through sixth data banks that is written in a frame period a is later read in a frame period a+4 (or a+3), where a is an integer.

According to yet another aspect of the present invention, the dual-bank memories mentioned above are utilized in combination with a plurality of pipelined processing units which receive input Reed-Solomon codewords and which execute computations to identify error locations and error values contained in the input codewords. Preferably, the plurality of pipelined processing units and the memories are operative in response to a same clock signal rate.

According to still another aspect of the present invention, each codeword contains n bytes, and each of the memory banks has a capacity of n bytes, where n is a positive integer. Preferably, a maximum latency of each of the plurality of pipelined processing units is n cycles, and each of the memory access frame periods is n cycles.

BRIEF DESCRIPTION OF THE DRAWINGS

The above and other objects and advantages of the present invention will become readily apparent from the detailed description that follows, with reference to the accompanying drawings, in which.

DETAILED DESCRIPTION OF THE PREFERRED EMBODIMENTS

Figure 1:
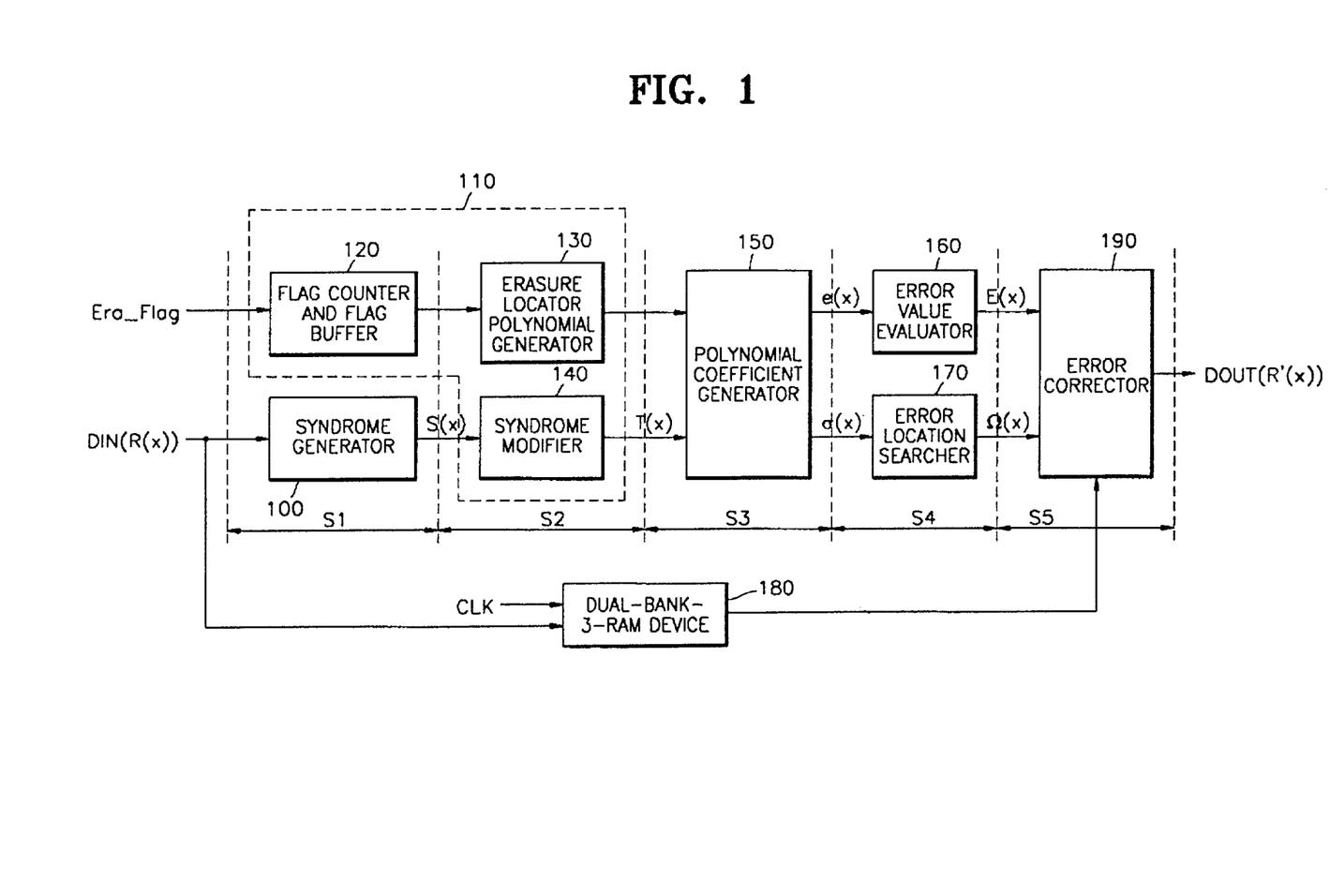
FIG. 1 is a block diagram of a high-speed block pipelined Reed-Solomon decoder according to the present invention.

FIG. 1 illustrates a high-speed block pipelined Reed-Solomon decoder according to an embodiment of the present invention. The Reed-Solomon decoder of this embodiment is capable of both error and erasure correction. As shown, the Reed-Solomon decoder computations are pipelined into five (5) stages S1 through S5.

For error correction only, the configuration of FIG. 1 would exclude the elements contained within the dashed-line 110, in which case only four (4) pipelined stages would be needed.

The Reed-Solomon decoder of the embodiment of FIG. 1 is equipped with a dual-bank 3-RAM device 180 for temporarily storing the input data DIN, i.e., the codeword R(x). This device is made up of three memories, for example, three RAMs, each of which has two banks. A circular control mechanism is employed to execute write/read operations in response to a data input clock signal CLK. Briefly, the dual-bank 3-RAM device 180 writes the input data DIN to a bank of a RAM selected from among the three RAMs, and reads data from a bank of one of the other RAMs. The structure and operation of the dual-bank-3-RAM device 180 will be described later in greater detail with reference to FIG. 3.

Referring still to FIG. 1, the Reed-Solomon decoder (for error and erasure correction) also includes a syndrome generator 100, a flag counter and flag buffer 120, an erasure locator polynomial generator 130, a syndrome modifier 140, a polynomial coefficient generator 150, an error value evaluator 160, an error location searcher 170, and an error corrector 190. As mentioned previously, the computations executed by these components are pipelined into stages S1 through S5.

In stage S1, the syndrome generator 100 computes a syndrome S(x) from the input data DIN. Also, the flag counter and flag buffer 120 counts the number of erasure flags Era_Flag supplied in synchronization with the input data DIN, and buffers the erasure flags Era_Flag. In this regard, if there are no erasure flags Era_Flag, or if the number of the input erasure flags Era_Flag is beyond an allowable correction range, error correction is exclusively performed. That is, an allowable correction range can be defined such that error correction alone is carried out if more erasure flags Era_Flag are input than the number of erasure flags of the allowable correction range. Again, the flag counter and flag buffer 120 is not included in a Reed-Solomon decoder that is configured for error correction alone.

In stage S2, the syndrome modifier 140 modifies the syndrome S(x) generated by the syndrome generator 100 with the buffered erasure flags, and outputs a modified syndrome T(x). (For error correction only, the syndrome S(x) is not modified and the syndrome modifier 140 is omitted.) The erasure locator polynomial generator 130 generates an erasure locator polynomial using the buffered erasure flags. As mentioned above, when the number of input erasure flags Era_Flag is equal to zero, or is beyond an allowable correction range, error correction alone is conducted. In this case, the erasure locator polynomial generator 130 generates a constant (e.g., value 1) in place of an erasure locator polynomial.

In stage S3, the polynomial coefficient generator 150 generates the coefficients of an error locator polynomial $\sigma(x)$ for error location searching, and an error evaluator polynomial $e(x)$ for error evaluation, using the modified syndrome T(x) and the erasure locator polynomial (or the constant 1). In this embodiment, the polynomial coefficient generator 150 utilizes a Euclidean algorithm. However, it will be appreciated that other known algorithms may be used as well. Once again, for error correction only, the elements contained within block 110 are excluded, and thus the coefficients of the error locator polynomial $\sigma(x)$ and the error evaluator polynomial $e(x)$ are generated using the (unmodified) syndrome S(x) and a constant of 1.

In stage S4, the error value evaluator 160 calculates error values and the error location searcher 170 calculates error locations based on the coefficients of the error locator polynomial $\sigma(x)$ and an error evaluator polynomial $e(x)$. For example, a Chien Search algorithm may be used to calculate the solution of the error locator polynomial $\sigma(x)$ and transform the obtained solution into a polynomial form. The transformed error locator polynomial, which is expressed as $\Omega(x)$, is used to calculate error locations. Likewise, the error value evaluator 160 calculates an error evaluator polynomial E(x) from the coefficients supplied by the polynomial coefficient generator 150. Herein, the error location searcher 170 and the error value evaluator 160 can be collectively referred to as an "error location and error value evaluator".

In stage S5, the error corrector 190 of FIG. 1 accesses the dual-bank 3-RAM device 180 to read the data DIN previously written thereto, and then corrects the errors of the read data with reference to the error locations identified by the error location searcher 170 and with reference to the error values calculated by the error value evaluator 160. In particular, the error corrector 190 corrects the errors, contained in the input data DIN retrieved from the dual-bank 3-RAM device 180, by summing the input data DIN and the calculated error values, to thereby obtain output data DOUT (i.e., corrected data R'(x)).

Although not illustrated, each pipelined processing block of the Reed-Solomon decoder shown in FIG. 1 performs the corresponding computations of stages S1 through S5 in response to a system clock signal.

Figure 2:
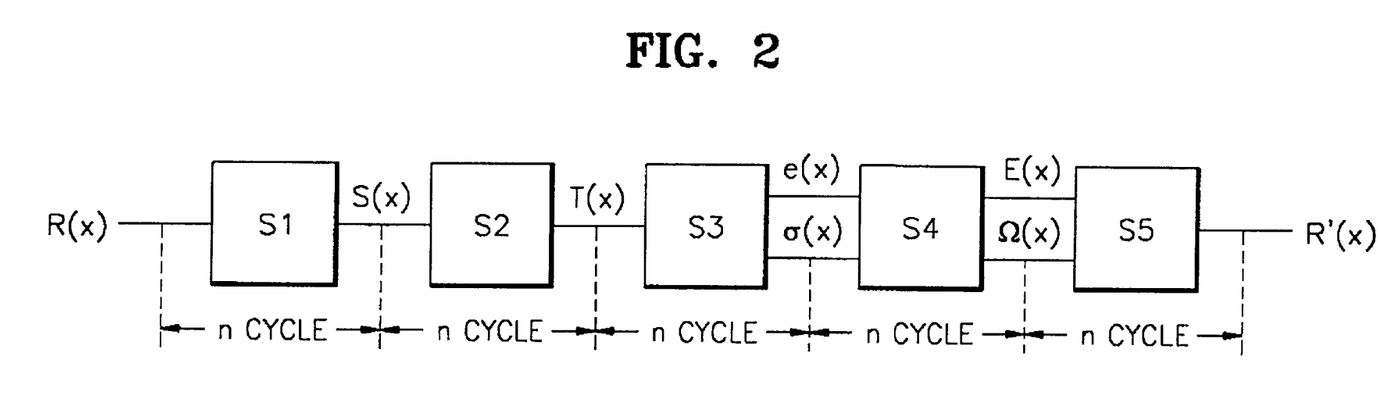
FIG. 2 is a diagram for describing latencies of the processing blocks of the Reed-Solomon decoder of FIG. 1.

FIG. 2 illustrates the latency of the stages S1 through S5 of the Reed-Solomon decoder of FIG. 1. As shown, the maximum latency of each processing block of stages S1, S2, S4 and S5 is n cycles (1 frame), where n is the number of bytes in each codeword. Likewise, the maximum latency of the processing block of stage S3 is n cycles as well. In this regard, it is noted that co-pending U.S. patent application Ser. No. 09/528,676, filed Mar. 20, 2000, the entirety of which is incorporated herein by reference, is directed to a technique for reducing the maximum latency of the third stage S3 (polynomial coefficient generation) to n cycles.

Accordingly, as illustrated in FIG. 2, the maximum latency of the Reed-Solomon computational blocks is n cycles. In general, pipelining is limited by the unit or block having the longest latency. However, even though the maximum latency of the processing blocks is n cycles or 1 frame, use of a conventional Reed-Solomon decoder memory to temporarily store the input codeword prior to correction would create a bottleneck. This is because the conventional memory requires at least 2n cycles or 2 frames to first store the codeword during stage S1, and to then retrieve the codeword for correction thereof at stage S5. In contrast, and as described below, the dual-bank 3-RAM device of present invention overcomes this drawback by reducing the latency of the memory write/read operations to n cycles or 1 frame.

Figure 3:
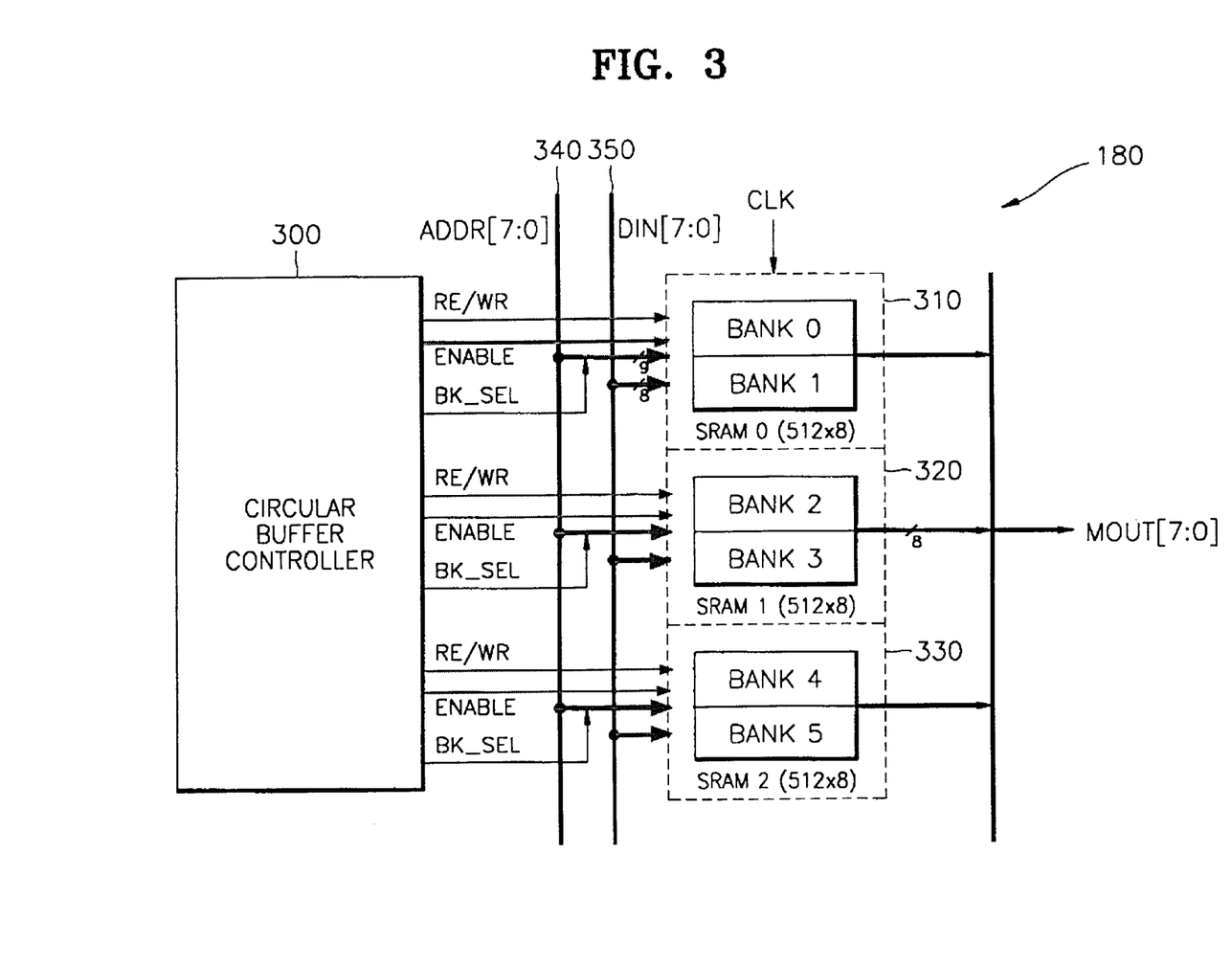
FIG. 3 is a block diagram of a preferred embodiment of a dual-bank 3-RAM device according to the present invention.

FIG. 3 is a block diagram of a preferred embodiment of the dual-bank 3-RAM device 180 shown in FIG. 1. As shown in FIG. 3, the dual-bank 3-RAM device 180 includes a circular buffer controller 300, a first dual-bank RAM 310, a second dual-bank RAM 320, and a third dual-bank RAM 330. The first dual-bank RAM 310 is partitioned into BANK 0 and BANK 1, the second dual-bank RAM 320 is partitioned into BANK 2 and BANK 3, and the third dual-bank RAM 330 is partitioned into BANK 4 and BANK 5. An address signal ADDR [7:0] is supplied by an 8-bit address bus 340, and the input data DIN [7:0] is supplied by an 8-bit data bus 350. The output of the dual-bank 3-RAM device 180 is an 8-bit parallel signal MOUT [7:0], and is applied to the error corrector 190 shown in FIG. 1.

The circular buffer controller 300 applies a read/write command RE/WR, an enable signal ENABLE, and a bank select signal BK_SEL to each of the RAMs 310, 320 and 330. The read/write command RE/WR specifies a read or write operation for each of the RAMs 310, 320 and 330, and the enable signal ENABLE selectively enables each of the RAMs 310, 320 and 330. Also, the bank select signal BK_SEL is added to the address signal ADDR [7:0] for the purpose of selecting one of the two banks of each of the RAMs 310, 320 and 330. For example, if the bank select signal BK_SEL is 0, a first bank of the two banks of a corresponding RAM is selected, and if the bank select signal BK_SEL is 1, a second bank of the two banks of a corresponding RAM is selected. In this manner, the read/write command RE/WR, the enable signal ENABLE, and the bank select signal BK_SEL collectively function as a write bank pointer and/or a read bank point which specifies writing and/or reading of selected individual banks of the RAMs 310, 320 and 330.

In operation, the circular buffer controller 300 effectively sets both a write bank pointer and a read bank pointer in each memory cycle. These write and read bank pointers are set such that the write bank and the read bank are in different ones of the RAMs 310, 320 and 330, and such that a predetermined offset is maintained between the write bank and the read bank from memory cycle to memory cycle. In this manner, both the writing of one frame of data (i.e., one codeword) and the reading of another frame of data may be simultaneously carried out in each of successive memory cycles.

More particularly, in each memory cycle and in synchronization with a clock signal CLK, the circular buffer controller 300 applies the enable signal ENABLE to two of the RAMs 310, 320 and 330, to thereby enable those two corresponding RAMs. Further, the circular buffer controller 300 applies a read command RE to one of the two enabled RAMs and a write command WR to the other of the two enabled RAMs. Still further, the circular buffer controller 300 adds the 1-bit bank select signals BK_SEL to the address signals ADDR[7;0] applied to each of the enabled RAMs, to thereby select one of the two banks of each of the enabled RAMs. (Effectively, a 9-bit address signal is applied to each of the RAMs 310, 320 and 330.) Thus, for each memory cycle, one bank of one RAM is write enabled, and one bank of a different RAM is read enabled.

Each of the RAMs 310, 320 and 330 may be implemented as a static random access memories (i.e., SRAM 0, SRAM 1 and SRAM 2). Preferably, the memory capacity of each bank is sufficient to store one frame or codeword of data. Generally, each bank should therefore have a capacity of n symbols (bytes) for the RS(n,k) code, and each RAM should have a capacity of 2n symbols. In the example of FIG. 3, the bank of each dual bank RAM can store data having a maximum length of 256 bytes over a Galois field $GF(2^8)$.

Table 1 below shows the size of each RAM and each bank when a Reed-Solomon (RS) code (n,k) is present over a Galois field $GF(2^m)$, where n is the length (number of symbols or bytes) of a codeword, k is the length (number of symbols or bytes) of the input data prior to coding, and m is the number of bits per byte.

TABLE 1

| | Bank size | RAM size | Data width | Address width |
|---|---|---|---|---|
| RS(n, k) code, $GF(2^m)$ | n | 2n | m | P + 1, where P is the smallest integer which satisfies $\log_2 n \leq P$ |
| If n = 256 and m = 8 | 256 | 512 | 8 | 8 + 1 = 9 |

Here, the memory address width is defined as a value obtained by adding 1 to a minimum of an integer P which satisfies the condition of $\log_2 n \leq P$. As previously suggested, the addition of 1 is the result of the selection of a bank using the MSB of the RAM address. As shown in Table 1, when n=256 and m=8, the bank size is 256 bytes and the RAM size is 512 bytes. Here, the data width is 8 bits and the address width is 9 bits.

Figure 4:
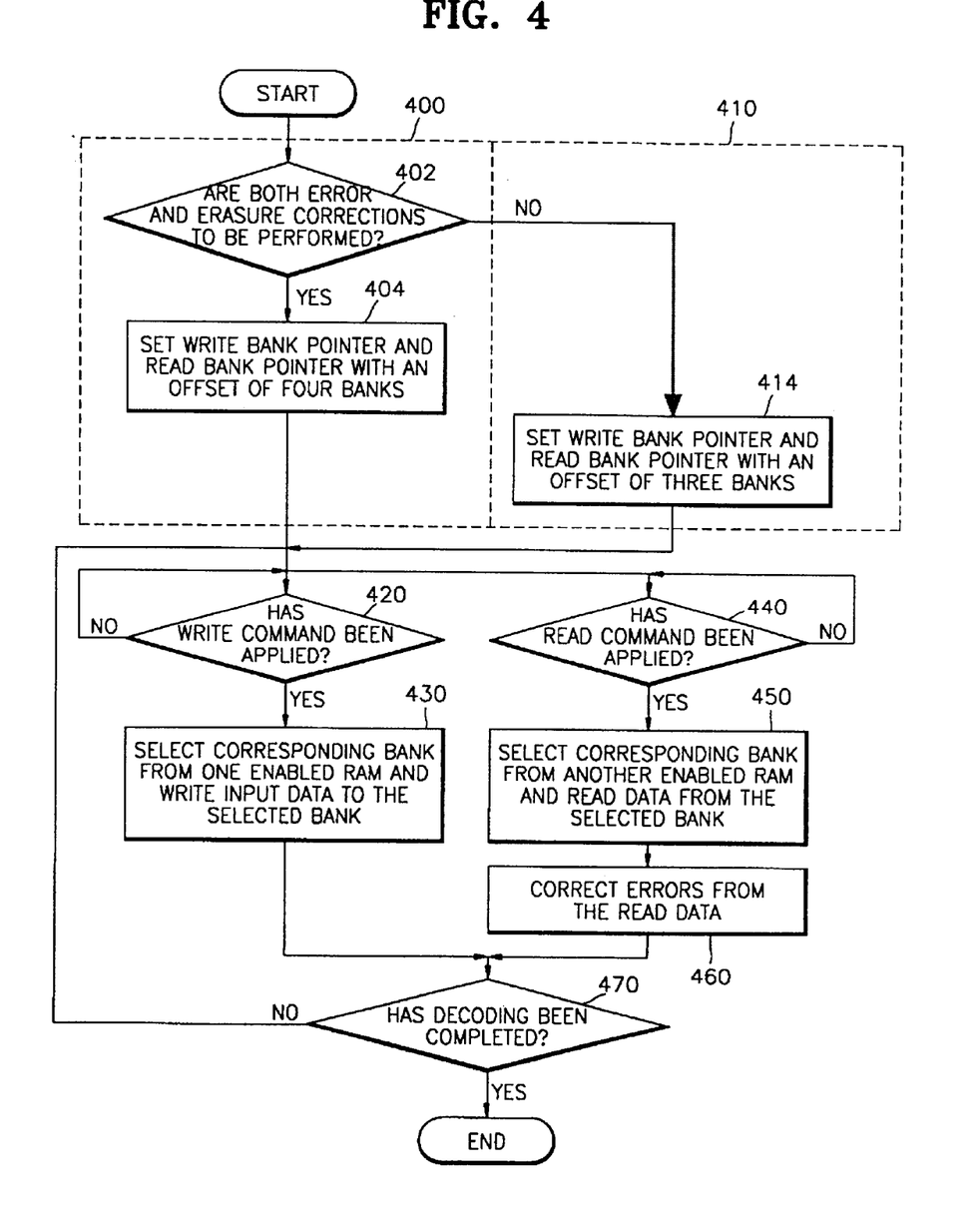
FIG. 4 is a flowchart illustrating a preferred embodiment of a method of accessing the dual-bank 3-RAM device according to the present invention.

The operation of the dual-bank 3-RAM device 180 will be described in greater detail with reference to FIGS. 3 and 4, where FIG. 4 is a flowchart illustrating a method of accessing the dual-bank 3-RAM device 180 discussed above in connection with FIG. 3.

When accessing the dual-bank-3-RAM device 180, the operational mode of the Reed-Solomon decoder is identified, i.e., whether both error and erasure correction is to be performed, or error correction alone is to be performed. Referring to FIG. 4, the setting of the write bank pointer and the read bank pointer is different for error and erasure correction (Step 400) than it is for error correction alone (Step 410).

In particular, at Step 402, a determination is made as to whether both error and erasure correction is to be executed. As described previously, this is done by checking the number of erasure flags Era_Flag input in synchronization with the input data DIN. If there are one or more erasure flags Era_Flag up to an allowable maximum, then both error and erasure correction is executed.

Figure 5:
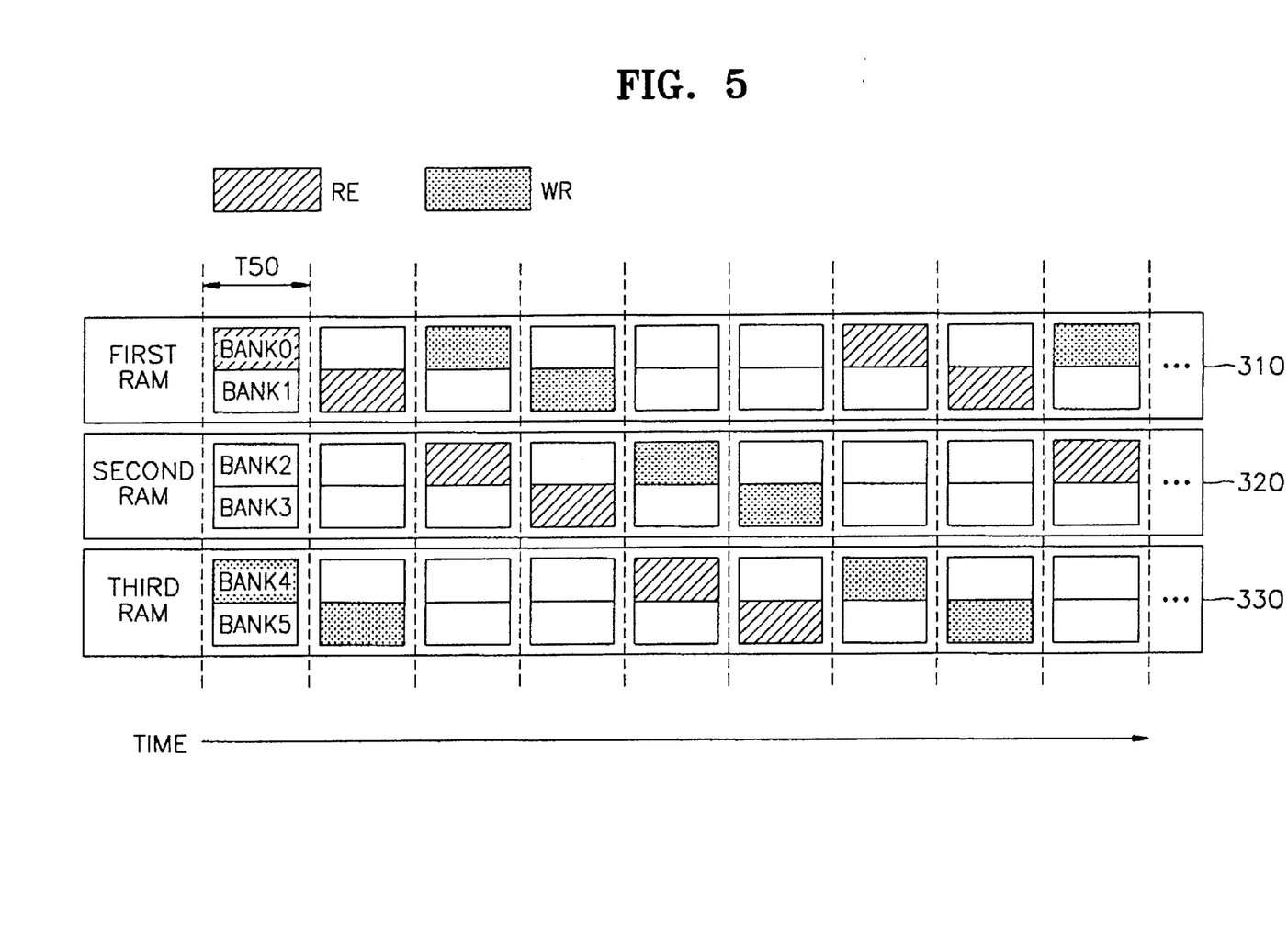
FIGS. 5 and 6 are diagrams for describing the selection of banks during write/read operations in the dual-bank 3-RAM device of FIG. 3.

If it is determined in step 402 that both error and erasure corrections are to be performed, then Step 404 is executed where the circular buffer controller 300 sets an offset between a write bank pointer and a read bank pointer to four (4) banks. This offset between the write bank pointer and the read bank pointer is described in more detail with reference to FIG. 5. In the first frame T50 of the example of FIG. 5, the read pointer is set to BANK 0 of the first RAM, and the write pointer is set to BANK 4 of the third RAM. Thus, the offset from the read bank pointer to the write bank pointer is four (4) banks. The read and write pointer are then incremented in each of the successive frames as shown in FIG. 5, and the offset of four (4) banks from the read bank pointer to the write bank pointer is maintained in each frame. If the read bank pointer is expressed as BANK#, then the write bank pointer is expressed as BANK(#+4) MOD 6, where the number 6 denotes the total number of banks.

If the writing of any particular bank is arbitrarily considered to occur in a "first" frame, then the offset of four (4) will result in the reading of that same particular bank in a "fifth" frame. For example, consider BANK 4 of the third RAM in FIG. 5. This bank is written in the first frame T50, and then read in the fifth frame. This timing corresponds to the number of stages (five) of pipelined computations in the Reed-Solomon decoder for both error and erasure correction. Thus, if input data DIN is written to BANK 4 at the first computational stage, the same data DIN can be read from BANK 4 at the fifth computational stage of the pipelined decoder.

Figure 6:
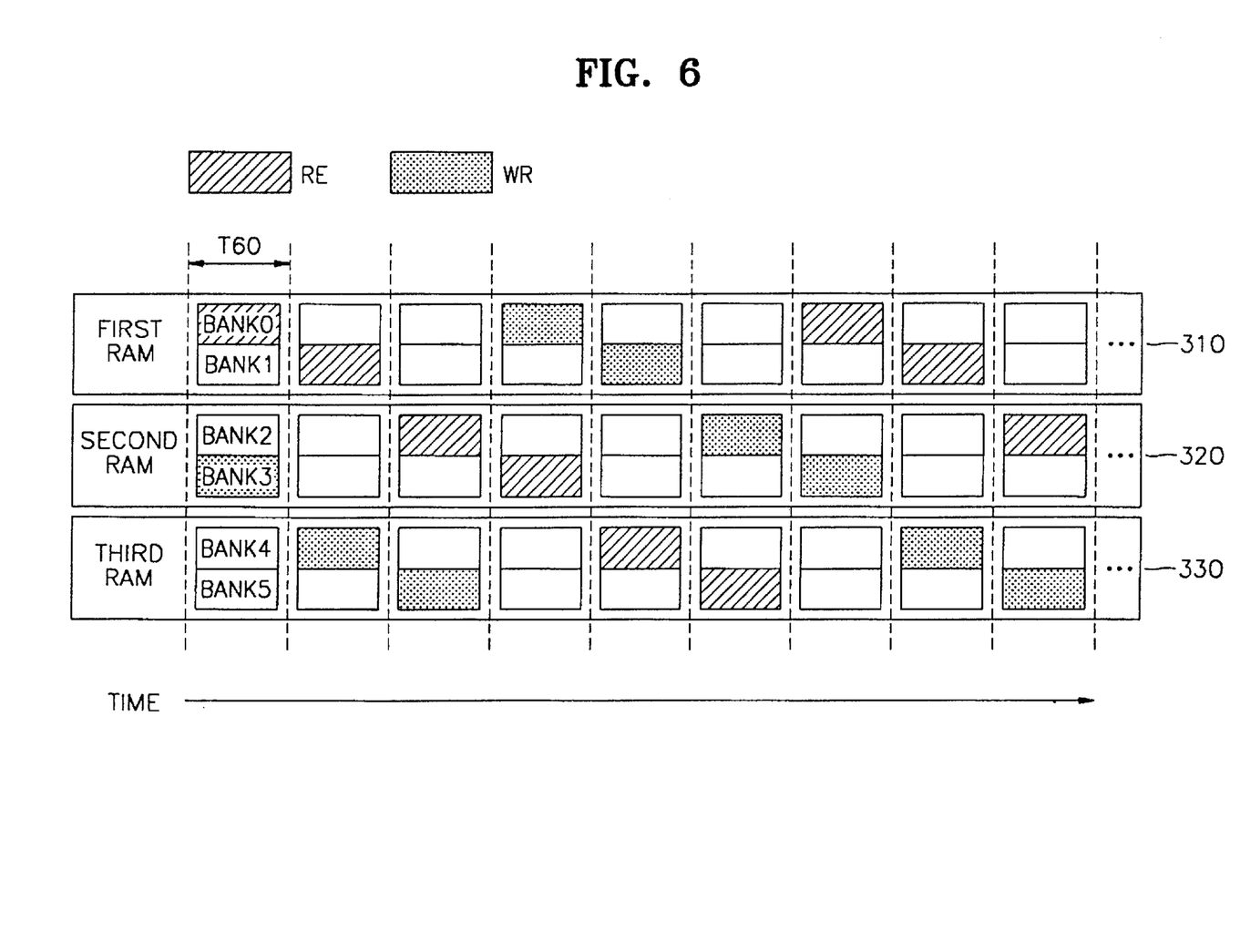

Returning to FIG. 4, if it is instead determined in step 402 that error correction only is to be performed, then Step 414 is executed where the circular buffer controller 300 sets an offset between a write bank pointer and a read bank pointer to three (3) banks. Correction of errors only occurs when no error flag Era_Flag is input, or when the number of the input error flags Era_Flag is beyond the allowable correction range. The offset of three (3) banks between the write bank pointer and the read bank pointer is described in more detail with reference to FIG. 6. In the first frame T60 of the example of FIG. 6, the read pointer is set to BANK 0 of the first RAM, and the write pointer is set to BANK 3 of the second RAM. Thus, the offset from the read bank pointer to the write bank pointer is three (3) banks. The read and write pointer are then incremented in each of the successive frames as shown in FIG. 6, and the offset of three (3) banks from the read bank pointer to the write bank pointer is maintained in each frame. If the read bank pointer is expressed as BANK#, then the write bank pointer is expressed as BANK(#+3) MOD 6.

If the writing of any particular bank is arbitrarily considered to occur in a "first" frame, then the offset of three (3) will result in the reading of that same particular bank in a "fourth" frame. For example, consider BANK 3 of the second RAM in FIG. 6. This bank is written in the first frame T60, and then read in the fourth frame. This timing corresponds to the number of stages (four) of pipelined computations in the Reed-Solomon decoder for error correction only. Thus, if input data DIN is written to BANK 3 at the first computational stage, the same data DIN can be read from BANK 3 at the fourth computational stage of the pipelined decoder.

Returning once again to FIG. 4, when a write command has been applied at step 420, the input data DIN is written to the bank designated by the write bank pointer at Step 430. Likewise, when a read command RE has been applied at step 440, the previously written input data DIN is read from the bank designated by the read bank pointer at Step 450. Then, at Step 460, the thus read data DIN is then utilized as described above in the correction of errors and/or erasures.

As illustrated in FIG. 4, the writing and reading of data are simultaneously executed. If coding has not been completed at Step 470, then the decoding process continues by returning to Steps for 420 and 440 for execution of a next memory frame.

As shown in FIG. 5 and FIG. 6, the offsets between the write bank pointer and the read bank pointer are set so as to prevent collisions (simultaneous access) within the same RAM, and to allow for writing and reading operations which are coincident with the timings of the computational stages of the pipelined decoder. Thus, the memory accessing sequence may be predefined and is responsive to the system clock, and thus the decoding of the Reed-Solomon decoder can be quickly achieved without memory bottlenecks.

Table 2 comparatively shows the number of memory access cycles required for a decoder having a single circular RAM, and the Reed-Solomon decoder of the present invention which utilizes three circular RAMs.

TABLE 2

| RS(n,k) code | Cycles of writing | Cycles of reading | Total reading and writing cycles | Memory access cycles required | System clocks required relative to data input clocks |
|---|---|---|---|---|---|
| 1 RAM | n | n | 2n | >2n | >2x |
| 3 RAMs | n | n | 2n | n | 1x |

As shown in Table 2, assuming that each cycle of writing data to and reading data from the RAMs is "n", the number of cycles required to access memories per frame of data is "2n" in the case of using a single RAM, and is only "n" for the case of three RAMs. In addition, when one RAM is used, a system clock rate must be increased to two or more times a data input clock rate. On the other hand, when three RAMs are used as in the present invention, the system clock rate can be the same as the data input clock rate. As a result, the writing and reading of data can be implemented with a lower-rate system clock signal.

Table 3 shows size and operational speed comparisons between the single RAM memory and the dual-bank 3-RAM device of the present invention, in the case where SRAMs are adopted for 256-byte codewords.

TABLE 3

| Memory | Size Absolute | Size Relative | Relative Speed |
|---|---|---|---|
| 1 RAM (1536 bytes) | 10996 | 0.66x | <0.5x |
| 3 RAMs (512*3 bytes) | 5573*3 | 1 | 1 |

As shown in Table 3, when the length of the codeword is 256 bytes, the size of a single 1536-byte SRAM is 0.66 times smaller than that of the three 512-byte SRAM configuration of the present invention. However, the operational speed of the three SRAMs is more than twice that of the single SRAM. Moreover, when considering the Reed-Solomon decoder as a whole, the percentage increase in the size thereof resulting from the use of three SRAMs is negligible in consideration of the increased operational speeds.

Figure 7:
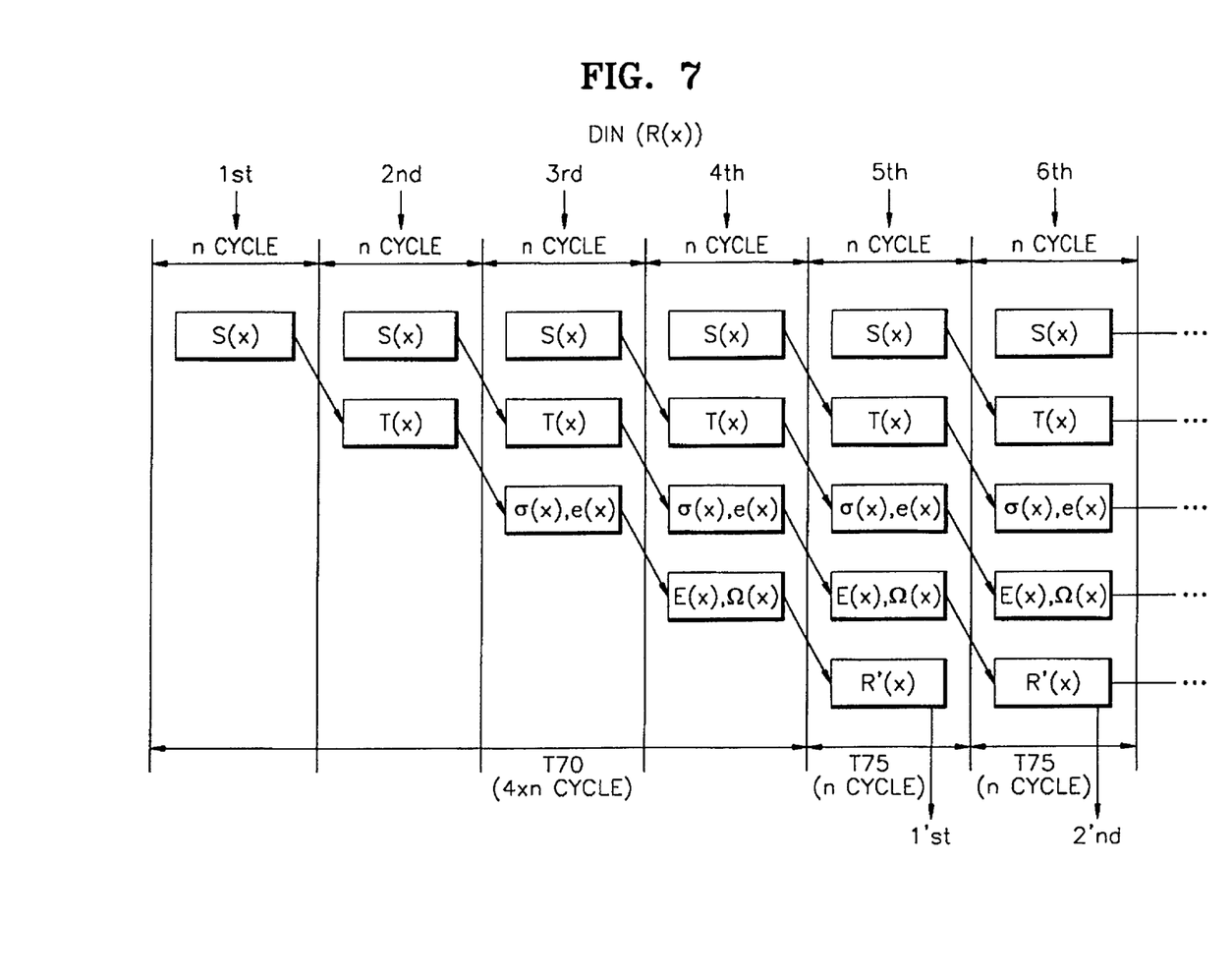
FIG. 7 is a timing diagram illustrating the pipelined operation of the Reed-Solomon decoder of FIG. 1.

FIG. 7 is a timing diagram of the decoding process of the block pipelined Reed-Solomon decoder according to an embodiment of the present invention. As shown in FIG. 7, the initial latency delay T70 is 4*n cycles, and error corrected data DOUT (i.e., R'(x)) is ouput every n cycles after the initial latency delay T70. Thereafter, once full pipelining of operations is achieved in the $5^{th}$ and $6^{th}$ frames, both the writing of data with the computation of S(x) and the reading of data with the computation of R'(x) may be carried out without creating a bottleneck since the latency of the write/read operations is n cycles. In FIG. 7, T75 represents a throughput delay interval in the actual processing procedure, rather than a latency delay interval.

The dual-bank 3-RAM device of the present invention, and the Reed-Solomon decoder adopting the dual-bank 3-RAM device of the present invention, have a wide range of applications including, for example, optical disk systems such as high-definition digital versatile discs (HD-DVD), HDTV, satellite communications, wireless communications equipment such as IMT, network systems such as giga-Ethernet, and ultrahigh speed systems.

In the dual-bank 3-RAM device of the present invention, the data input clock for accessing memories can be used as the system clock, so that the manufacture of the semiconductor device is simplified, power consumption is decreased, and the operational speed is increased. In addition, time expended accessing memories can be minimized such that the system clock rate is less affected by the memory access time, thereby virtually increasing the degree of freedom in the timing margins between blocks in the system design. Furthermore, the dual-bank 3-RAM device enables high-speed transmissions, which are particularly suitable for a high-speed pipelined Reed-Solomon decoder and ultrahigh speed systems adopting the Reed-Solomon decoder.

In the drawings and specification, typical preferred embodiments of the invention are disclosed and, although specific terms are employed, they are used in a generic and descriptive sense only and not for purposes of limitation. It will be understood by those skilled in the art that various changes in form and details may be made to the described embodiments without departing from the spirit and scope of the invention as defined by the appended claims.

What is claimed is:

1. A buffer circuit for simultaneous writing and reading of data during each of successive frame periods, comprising:
   a plurality of dual-bank RAMs; and
   a memory control circuit, coupled to said plurality of dual-bank RAMs, which enables writing to and reading from said plurality of dual-bank RAMs during each of the successive frame periods such that each bank of the dual-bank RAMs is read every given number of frame periods and is written every said given number of frame periods, and such that a read bank is contained in a different one of said plurality of dual-bank RAMs than is a write bank in each of the successive frame periods.

2. A buffer circuit for simultaneous writing and reading of data during each of successive frame periods, comprising:
   a first dual-bank RAM having a first bank and a second bank;
   a second dual-bank RAM having a third bank and a fourth bank;
   a third dual-bank RAM having a fifth bank and a sixth bank; and
   a memory control circuit, coupled to said first, second and third dual-bank RAMs, which enables reading from said first through sixth data banks in order during the successive frame periods such that each one of said first through sixth data banks is read every six frame periods, and which enables writing to said first through sixth data banks in order during the successive frame periods such that each one of said first through sixth data banks is written every six frame periods;
   wherein, during each of said frame periods, a one of said first through sixth data banks for which reading is enabled by said memory control circuit is contained in a different one of said first through third dual-bank RAMs than is a one of said first through sixth data banks for which writing is enabled by said memory control circuit.

3. The buffer circuit as claimed in claim 2, wherein, during each frame period, an offset from a data bank for which reading is enabled to a data bank for which writing is enabled is four data banks, such that each of said first through sixth data banks that is written in a frame period a is later read in a frame period a+4, where a is an integer.

4. The buffer circuit as claimed in claim 2, wherein, during each frame period, an offset from a data bank for which reading is enabled to a data bank for which writing is enabled is three data banks, such that each of said first through sixth data banks that is written in a frame period a is later read in a frame period a+3, where a is an integer.

5. The buffer circuit as claimed in claim 2, wherein
   during an a-th frame period, where a is an integer, the memory control circuit enables reading from the first bank of the first dual-bank RAM and writing to the fifth bank of the third dual-bank RAM,
   during an (a+1)-th frame period, the memory control circuit enables reading from the second bank of the first dual-bank RAM and writing to the sixth bank of the third dual-bank RAM,
   during an (a+2)-th frame period, the memory control circuit enables reading from the third bank of the second dual-bank RAM and writing to the first bank of the first dual-bank RAM,
   during an (a+3)-th frame period, the memory control circuit enables reading from the fourth bank of the second dual-bank RAM and writing to the second bank of the first dual-bank RAM,
   during an (a+4)-th frame period, the memory control circuit enables reading from the fifth bank of the third dual-bank RAM and writing to the third bank of the second dual-bank RAM, and
   during an (a+5)-th frame period, the memory control circuit enables reading from the sixth bank of the third dual-bank RAM and writing to the fourth bank of the second dual-bank RAM.

6. The buffer circuit as claimed in claim 2, wherein
   during an a-th frame period, where a is an integer, the memory control circuit enables reading from the first bank of the first dual-bank RAM and writing to the second bank of the second dual-bank RAM,
   during an (a+1)-th frame period, the memory control circuit enables reading from the second bank of the first dual-bank RAM and writing to the fifth bank of the third dual-bank RAM,
   during an (a+2)-th frame period, the memory control circuit enables reading from the third bank of the second dual-bank RAM and writing to the sixth bank of the third dual-bank RAM, during an (a+3)-th frame period, the memory control circuit enables reading from the fourth bank of the second dual-bank RAM and writing to the first bank of the first dual-bank RAM, during an (a+4)-th frame period, the memory control circuit enables reading from the fifth bank of the third dual-bank RAM and writing to the second bank of the first dual-bank RAM, and during an (a+5)-th frame period, the memory control circuit enables reading from the sixth bank of the third dual-bank RAM and writing to the third bank of the second dual-bank RAM.

7. A method for accessing a plurality of dual-bank memories, said method comprising enabling writing to and reading from the plurality of dual-bank memories during each of successive frame periods such that each bank of the dual-bank memories is read every given number of frame periods and is written every said given number of frame periods, and such that a read bank is contained in a different one of the plurality of dual-bank memories than is a write bank in each of the successive frame periods.

8. A method for accessing a memory device containing a first dual-bank RAM having a first bank and a second bank, a second dual-bank RAM having a third bank and a fourth bank, and a third dual-bank RAM having a fifth bank and a sixth bank, said method comprising:

enabling reading from the first through sixth data banks in order during successive frame periods such that each one of said first through sixth data banks is read every six frame periods; and enabling writing to said first through sixth data banks in order during the successive frame periods such that each one of said first through sixth data banks is written every six frame periods;

wherein, during each of said frame periods, a one of said first through sixth data banks for which reading is enabled is contained in a different one of said first through third dual-bank RAMs than is a one of said first through sixth data banks for which writing is enabled.

9. The method as claimed in claim 8, wherein, during each frame period, an offset from a data bank for which reading is enabled to a data bank for which writing is enabled is four data banks, such that each of said first through sixth data banks that is written in a frame period a is later read in a frame period a+4, where a is an integer.

10. The method as claimed in claim 8, wherein, during each frame period, an offset from a data bank for which reading is enabled to a data bank for which writing is enabled is three data banks, such that each of said first through sixth data banks that is written in a frame period a is later read in a frame period a+3, where a is an integer.

11. The method as claimed in claim 8, further comprising:

during an a-th frame period, where a is an integer, reading from the first bank of the first dual-bank RAM and writing to the fifth bank of the third dual-bank RAM, during an (a+1)-th frame period, reading from the second bank of the first dual-bank RAM and writing to the sixth bank of the third dual-bank RAM, during an (a+2)-th frame period, reading from the third bank of the second dual-bank RAM and writing to the first bank of the first dual-bank RAM, during an (a+3)-th frame period, reading from the fourth bank of the second dual-bank RAM and writing to the second bank of the first dual-bank RAM, during an (a+4)-th frame period, reading from the fifth bank of the third dual-bank RAM and writing to the third bank of the second dual-bank RAM, and during an (a+5)-th frame period, reading from the sixth bank of the third dual-bank RAM and writing to the fourth bank of the second dual-bank RAM.

12. The method as claimed in claim 8, further comprising:

during an a-th frame period, where a is an integer, reading from the first bank of the first dual-bank RAM and writing to the second bank of the second dual-bank RAM, during an (a+1)-th frame period, reading from the second bank of the first dual-bank RAM and writing to the fifth bank of the third dual-bank RAM, during an (a+2)-th frame period, reading from the third bank of the second dual-bank RAM and writing to the sixth bank of the third dual-bank RAM, during an (a+3)-th frame period, reading from the fourth bank of the second dual-bank RAM and writing to the first bank of the first dual-bank RAM, during an (a+4)-th frame period, reading from the fifth bank of the third dual-bank RAM and writing to the second bank of the first dual-bank RAM, and during an (a+5)-th frame period, reading from the sixth bank of the third dual-bank RAM and writing to the third bank of the second dual-bank RAM.

13. A pipelined Reed-Solomon decoder, comprising:

a plurality of pipelined processing units which receive input Reed-Solomon codewords and which executed computations to identify error locations and error values contained in the input codewords; and a buffer circuit which temporarily stores the input codewords during execution of the computations by the plurality of pipelined processing units;

wherein the buffer circuit comprises:

a plurality of dual-bank RAMs; and a memory control circuit, coupled to said plurality of dual-bank RAMs, which enables writing to and reading from said plurality of dual-bank RAMs during each of the successive frame periods such that each bank of the dual-bank RAMs is read every given number of frame periods and is written every said given number of frame periods, and such that a read bank is contained in a different one of said plurality of dual-bank RAMs than is a write bank in each of the successive frame periods.

14. A pipelined Reed-Solomon decoder, comprising:

a plurality of pipelined processing units which receive input Reed-Solomon codewords and which executed computations to identify error locations and error values contained in the input codewords; and a buffer circuit which temporarily stores the input codewords during execution of the computations by the plurality of pipelined processing units;

wherein the buffer circuit comprises:

a first dual-bank RAM having a first bank and a second bank;

a second dual-bank RAM having a third bank and a fourth bank;

a third dual-bank RAM having a fifth bank and a sixth bank; and a memory control circuit, coupled to said first, second and third dual-bank RAMs, which enables reading from said first through sixth data banks in order during the successive frame periods such that each one of said first through sixth data banks is read every six frame periods, and which enables writing to said first through sixth data banks in order during the successive frame periods such that each one of said first through sixth data banks is written every six frame periods;

wherein, during each of said frame periods, a one of said first through sixth data banks for which reading is enabled by said memory control circuit is contained in a different one of said first through third dual-bank RAMs than is a one of said first through sixth data banks for which writing is enabled by said memory control circuit.

15. The pipelined Reed-Solomon decoder as claimed in claim 14, wherein the plurality of pipelined processing units are comprised of 5 pipelined processing stages, and wherein, during each frame period, an offset from a data bank for which reading is enabled to a data bank for which writing is enabled is four data banks, such that each of said first through sixth data banks that is written in a frame period a is later read in a frame period a+4, where a is an integer.

16. The pipelined Reed-Solomon decoder as claimed in claim 14, wherein the plurality of pipelined processing units are comprised of 4 pipelined processing stages, and wherein, during each frame period, an offset from a data bank for which reading is enabled to a data bank for which writing is enabled is three data banks, such that each of said first through sixth data banks that is written in a frame period a is later read in a frame period a+3, where a is an integer.

17. The pipelined Reed-Solomon decoder as claimed in claim 14, wherein the plurality of pipelined processing units are operable in a first mode in which error and erasure correction is executed and in which 5 pipelined processing stages are operable, and in a second mode in which error correction only is executed and in which 4 pipelined processing stages are operable, wherein, during each frame period of the first mode, an offset from a data bank for which reading is enabled to a data bank for which writing is enabled is four data banks, such that each of said first through sixth data banks that is written in a frame period $a$ is later read in a frame period $a+4$, where $a$ is an integer, and wherein, during each frame period of the second mode, an offset from a data bank for which reading is enabled to a data bank for which writing is enabled is three data banks, such that each of said first through sixth data banks that is written in a frame period $a$ is later read in a frame period $a+3$.

18. The pipelined Reed-Solomon decoder as claimed in claim 14, wherein the plurality of pipelined processing units and the buffer circuit are operative in response to a same clock signal rate.

19. The pipelined Reed-Solomon decoder as claimed in claim 14, wherein each codeword contains n bytes, and wherein each of the first through sixth banks has a capacity of n bytes, where n is a positive integer.

20. The pipelined Reed-Solomon decoder as claimed in claim 19, wherein a maximum latency of each of the plurality of pipelined processing units is n cycles, and wherein each of the frame periods is n cycles.

* * * * *